(12) United States Patent
Venter

(10) Patent No.: US 9,117,970 B2
(45) Date of Patent: Aug. 25, 2015

(54) SILICON LIGHT EMITTING DEVICE AND METHOD OF FABRICATING SAME

(75) Inventor: Petrus Johannes Venter, Centurion (ZA)

(73) Assignee: INSIAVA (PTY) LIMITED, Pretoria (ZA)

( * ) Notice: Subject to any disclaimer, the term of this patent is extended or adjusted under 35 U.S.C. 154(b) by 0 days.

(21) Appl. No.: 13/574,333

(22) PCT Filed: Jan. 21, 2011

(86) PCT No.: PCT/IB2011/050279
§ 371 (c)(1),
(2), (4) Date: Oct. 10, 2012

(87) PCT Pub. No.: WO2011/089570
PCT Pub. Date: Jul. 28, 2011

(65) Prior Publication Data
US 2013/0026534 A1    Jan. 31, 2013

(30) Foreign Application Priority Data
Jan. 22, 2010    (ZA) ................................ 2010/00521

(51) Int. Cl.
*H01L 33/00* (2010.01)
*H01L 33/34* (2010.01)

(52) U.S. Cl.
CPC ............ *H01L 33/34* (2013.01); *H01L 33/0016* (2013.01)

(58) Field of Classification Search
CPC ...................................................... H01L 33/00
USPC ............................................ 257/86; 438/24
See application file for complete search history.

(56) References Cited

U.S. PATENT DOCUMENTS 5,994,720 A * 11/1999 Snyman et al. .................. 257/86
6,111,271 A    8/2000 Snyman et al.
(Continued)

FOREIGN PATENT DOCUMENTS

DE    100 00 707    7/2001
JP    2009 027077    2/2009

OTHER PUBLICATIONS

Snyman et al., Three Terminal n+ ppn Silicon CMOS Light Emitting Devices (450nm-750nm) with Three Order Increase in Quantum Efficiency, Jun. 20-23, 2005, p. 1161.*

(Continued)

*Primary Examiner* — Shaun Campbell
*Assistant Examiner* — Ismail Muse
(74) *Attorney, Agent, or Firm* — Nixon & Vanderhye PC

(57) ABSTRACT

A light emitting device (10) comprises a body (11) comprising a substrate (12) of a p-type semiconductor material. The substrate has an upper surface (14) and having formed therein on one side of the upper surface and according to a bulk semi-conductor fabrication process utilizing lateral active area isolation techniques: a first n+-type island (16) to form a first junction (24) between the first island and the substrate; and a second n+-type island (18) spaced laterally from the first island (16). The substrate provides a laterally extending link (20) between the islands having an upper surface. The upper surface of the link, an upper surface of the island (16) and an upper surface of the island (18) collectively form a planar interface (21) between the body (11) and an isolation layer (19) of the device. The device comprises a terminal arrangement to apply a reverse bias to the first junction, to cause the device to emit light. The device is configured to facilitate the transmission of the emitted light.

16 Claims, 9 Drawing Sheets

(56) References Cited

U.S. PATENT DOCUMENTS

| | | | |
|---|---|---|---|
| 8,362,679 B2 | 1/2013 | Du Plessis | |
| 8,395,226 B2 | 3/2013 | Du Plessis et al. | |
| 2007/0194213 A1* | 8/2007 | Augusto | 250/214.1 |
| 2011/0012502 A1* | 1/2011 | Du Plessis | 313/358 |
| 2011/0031893 A1 | 2/2011 | Snyman et al. | |
| 2011/0042701 A1 | 2/2011 | Du Plessis et al. | |
| 2011/0068716 A1 | 3/2011 | Snyman et al. | |
| 2012/0001681 A1 | 1/2012 | Du Plessis | |
| 2012/0009709 A1 | 1/2012 | Du Plessis | |

OTHER PUBLICATIONS

International Search Report for PCT/IB2011/050279 mailed Jun. 28, 2011.

International Preliminary Report on Patentability with a date of completion of Apr. 3, 2012.

L.Snyman et al., "Increasing the Efficiency of p+np+ Injection-Avalanche Si CMOS LED's (450nm-750nm) by Means of Depletion Layer Profiling and Reach-Through Techniques", Proceedings of SPIE—the International Society for Optical Engineering, vol. 6898, Jan. 21, 2008, 12 pages.

L. Snyman et al., "A Dependency of Quantum Efficiency of Silicon CMOS n+pp+ LEDs on Current Density", IEEE Photonics Technology Letters, vol. 17, No. 10, Oct. 2005, pp. 2041-2043.

T.H. Yeh et al., Light Emission of PN Junction, IBM Technical Disclosure Bulletin, International Business Machines Corp., vol. 9, No. 7, Dec. 1, 1966, p. 919.

P.J. Venter et al., "Improved Silicon Light Emission for Reach-and Punch-Through Devices in Standard CMOS", Proceedings of SPIE—the International Society for Optical Engineering—Optoelectronic Interconnects and Component Integration IX, vol. 7607, Jan. 25, 2010, pp. 76070Z-1 to-9 & XP002639932.

P. Venter et al., "Improved Efficiency of CMOS Light Emitters in Punch Through with Field Oxide Manipulation", Microelectronics (ICM), 2010 International Conference on, IEEE, Dec. 19, 2010, pp. 36-39.

U.S. Appl. No. 13/810,809 (Du Plessis et al.) filed Apr. 1, 2013.

U.S. Appl. No. 13/161,113 (Du Plessis) filed Jun. 15, 2011.

U.S. Appl. No. 13/139,653 (Du Plessis) filed Jun. 14, 2011 (now allowed).

U.S. Appl. No. 12/865,609 (Snyman et al.) filed Jul. 30, 2010.

U.S. Appl. No. 12/863,743 (Snyman et al.) filed Jul. 20, 2010.

U.S. Appl. No. 12/740,597 (Du Plessis et al.) filed Oct. 20, 2010.

* cited by examiner

SILICON LIGHT EMITTING DEVICE AND METHOD OF FABRICATING SAME

This application is the U.S. national phase of International Application No. PCT/IB2011/050279 filed 21 Jan. 2011 which designated the U.S. and claims priority to ZA 2010/00521 filed 22 Jan. 2010, the entire contents of each of which are hereby incorporated by reference.

INTRODUCTION AND BACKGROUND

This invention relates to optoelectronic devices and more particularly to light emitting devices fabricated from a semiconductor material, such as silicon, and a method of fabricating such a device.

Light emitting devices fabricated from silicon are known in the art. One such a device is a two junction device having a sandwiched configuration of immediately adjacent doped $p^+np^+$ or $n^+pn^+$ regions. The device comprises a first pn junction which is reverse biased into a breakdown mode, to emit light and a neighbouring second pn junction which is forward biased to inject carriers into the first junction, thereby to improve the internal quantum efficiency of the device. It is also known to drive the device into a punch-through mode wherein a depletion region associated with the reverse biased junction punches through to a depletion region associated with the forward biased junction, thereby to lower an energy barrier of the forward biased junction and facilitate the injection of carriers from the forward biased junction into the reverse biased junction and to improve electroluminescence effects in the device.

Another known light emitting device has a sandwiched configuration of immediately adjacent doped $n^+pp^+$ or $p^+nn^+$ regions. The device comprises a first pn junction, which is reverse biased into a breakdown mode to emit light and a neighbouring $pp^+$ or $nn^+$ junction. In use, the device may be driven into a reach-through mode, in that the depletion region of the reverse biased junction reaches through the p region to the $p^+$ region or through the n region to the $n^+$ region, as the case may be, before the reverse biased junction reaches breakdown, thereby to improve electroluminescence effects in the device.

In modern standard bulk CMOS, including BiCMOS, fabrication processes, more particularly sub-micron processes, lateral device isolation techniques, such as local oxidation of silicon (LOCOS) and/or shallow trench isolation (STI), are used to form physical isolation structures or barriers comprising bodies of an isolating material for laterally isolating from one another doped implanted $n^+$ or $p^+$ active regions for forming junctions with a p- or n-type bulk substrate material. These techniques, by necessity, cause the barriers to be formed between mutually facing faces of the implanted active regions. These barriers between the doped active regions would inhibit the aforementioned punch-through and reach-through modes.

In other known devices, a gate structure is formed between implanted regions, which structure inhibits transmission of emitted light transversely and outwardly from the device.

OBJECT OF THE INVENTION

Accordingly it is an object of the present invention to provide a light emitting device and a method of fabricating same with which the applicant believes the aforementioned disadvantages may at least be alleviated or which may provided a useful alternative for the known devices and methods.

SUMMARY OF THE INVENTION

According to the invention there is provided a light emitting device comprising
 a body comprising a substrate of a semiconductor material of a first doping kind of a first doping concentration;
 the substrate having an upper surface and having formed therein on one side of the upper surface and according to a bulk semiconductor fabrication process utilizing lateral active area isolation techniques utilizing bodies of an isolation material:
  a first island of a second doping kind of a second doping concentration to form a first junction between the first island and the substrate, the first island having an upper surface;
  a second island of a third doping kind of a third doping concentration spaced laterally from the first island, so that the first island has a first face and the second island has a second face, the first and second faces mutually facing one another, and the second island having an upper surface;
 the substrate providing a laterally extending link between the first face and the second face and having an upper surface coinciding with the upper surface of the substrate, so that the upper surface of the link, the upper surface of the first island and the upper surface of the second island collectively form a planar interface between the body and an isolation layer of the device;
 a terminal arrangement connected to the body and configured to apply a reverse bias to the first junction to cause a breakdown mode of the first junction, thereby to cause the device to emit light; and
 the device being configured in a region of the device to facilitate the transmission of the emitted light, said region extending on another side of the upper surface of the substrate perpendicularly away from a zone comprising at least one of the first face and at least part of a depletion region which, in use, extends from the first face into the link.

The zone may be an upper surface zone covering at least one of the first face and at least part of the depletion region which, in use, extends from the first face into the link, preferably both.

The first doping kind may be p-type, alternatively it may be n-type.

In one embodiment of the device, the first doping kind may be opposite to the second doping kind and the third doping kind may be the same as the second doping kind. The second and third doping concentrations may be higher than the first doping concentration.

The terminal arrangement may be configured to apply a forward bias to a second junction which is formed between the second island and the substrate.

In another embodiment of the device, the first doping kind may be opposite to the second doping kind, the third doping kind may be the same as the first doping kind and the first doping concentration may be lower than the third doping concentration.

The device may be configured such that the depletion region extending from the first face extends through the link and reaches the second island, before the first junction enters the breakdown mode.

The semiconductor material may comprise an indirect bandgap semiconductor material. The indirect bandgap semiconductor material may comprise silicon.

The bulk semiconductor fabrication process may be one of a sub-micron bulk CMOS and BiCMOS process.

The linked first and second islands, when viewed in plan, may at least partially be circumscribed by the isolation layer of the device.

Also included within the scope of the present invention is a method of fabricating a light emitting device, the method comprising the steps of:
utilizing a bulk semiconductor fabrication process utilizing lateral active region isolation techniques;
forming in a substrate of a semiconductor material of a first doping kind and on one side of an upper surface of the substrate, a first island of a second doping kind and a second island of a third doping kind spaced laterally from the first island, so that the first and second islands have mutually facing faces;
inhibiting formation of a barrier of an isolating material between at least parts of the mutually facing faces; and
adapting a region of the device between the first and second islands and on another side of the upper surface, to facilitate transmission of light emitted by the device in a direction away from the substrate.

BRIEF DESCRIPTION OF THE ACCOMPANYING DIAGRAMS

The invention will now further be described by way of example only with reference to the accompanying diagrams wherein.

Figure 8A:
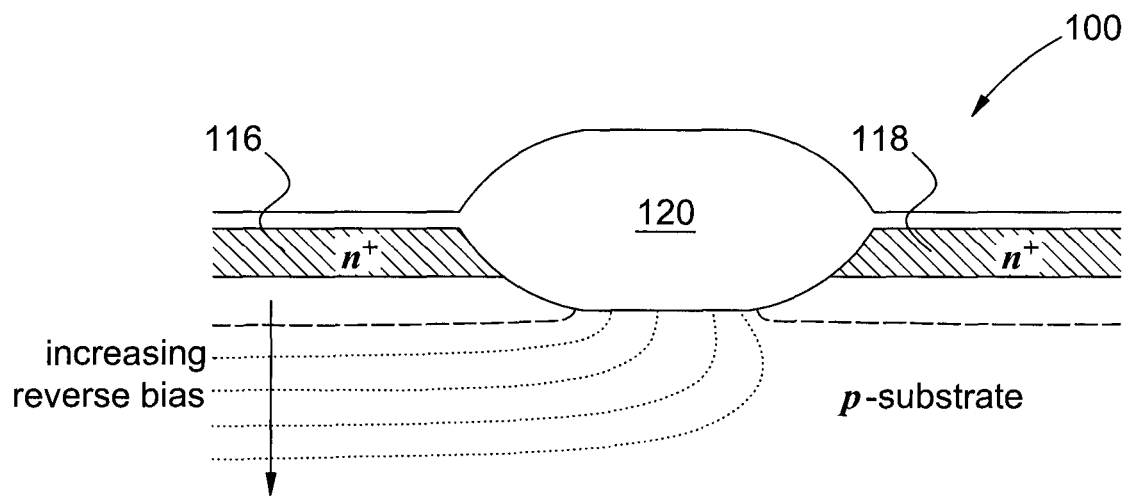
Figure 9A:
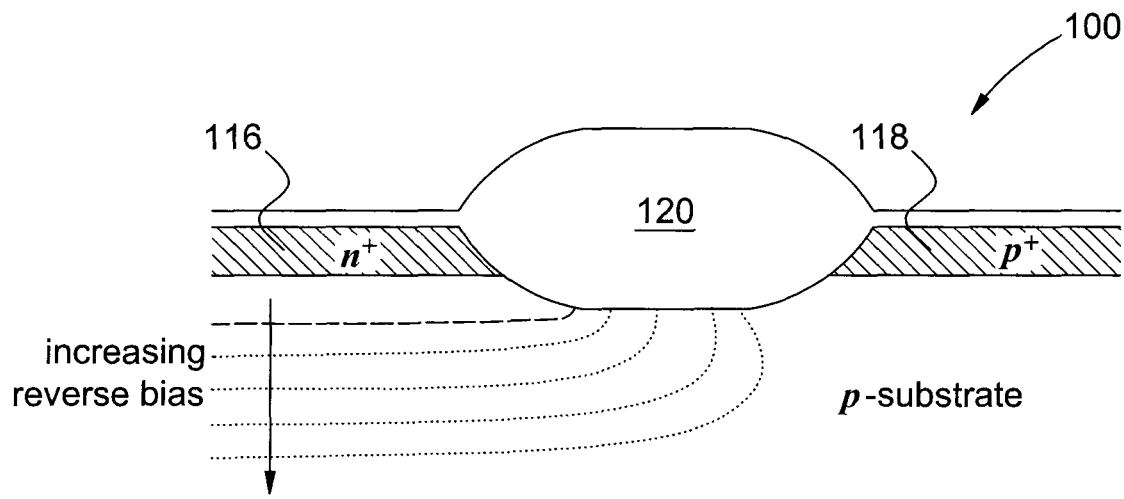
Figure 9B:
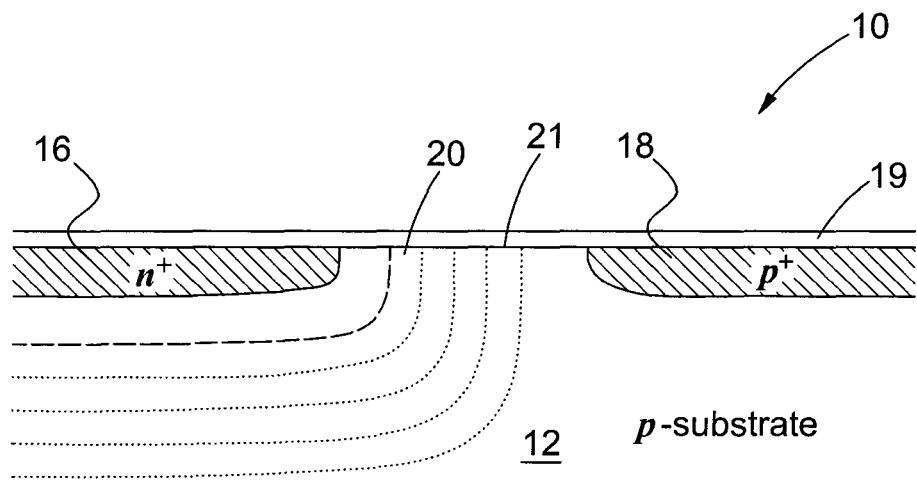
Figure 10:
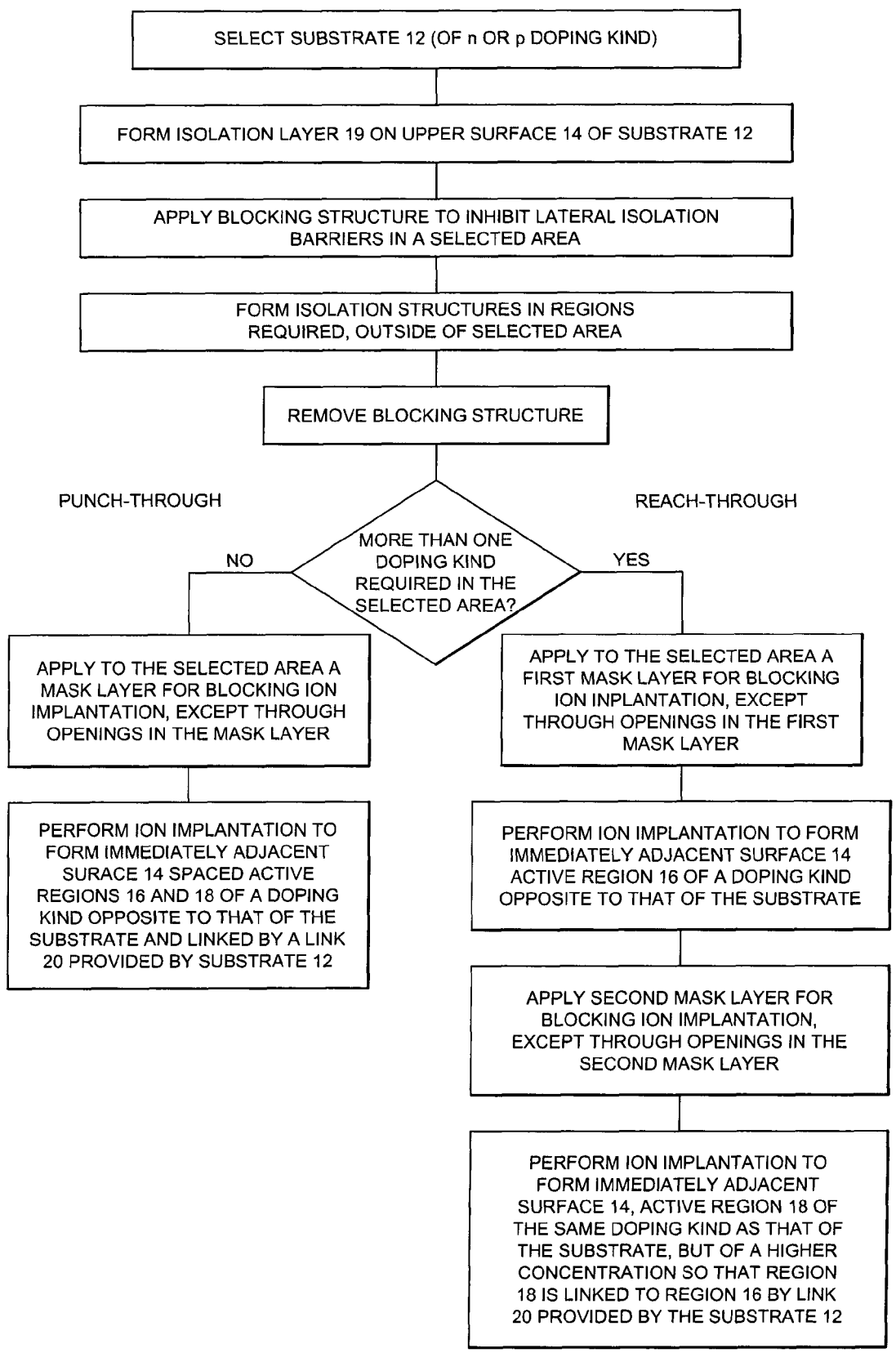

FIGS. 6(a) to (d) illustrate relevant steps in a standard prior art bulk CMOS process for fabricating devices;

FIGS. 7(a) to (d) illustrate relevant steps in a modified bulk CMOS process for fabricating the light emitting device according to the invention;

FIGS. 8(a) and (b) are comparative illustrations of the spatial behaviour of the depletion regions of a prior art device and a device according to the invention respectively, when driven into punch-through;

FIGS. 9(a) and (b) are similar comparative illustrations for devices configured to be driven into reach-through; and FIG. 10 is a flow diagram of methods according to the invention for forming reach-through and punch-through light emitting devices by adapting a standard bulk CMOS or BiCMOS fabrication process.

DESCRIPTION OF A PREFERRED EMBODIMENT OF THE INVENTION

Figure 3:
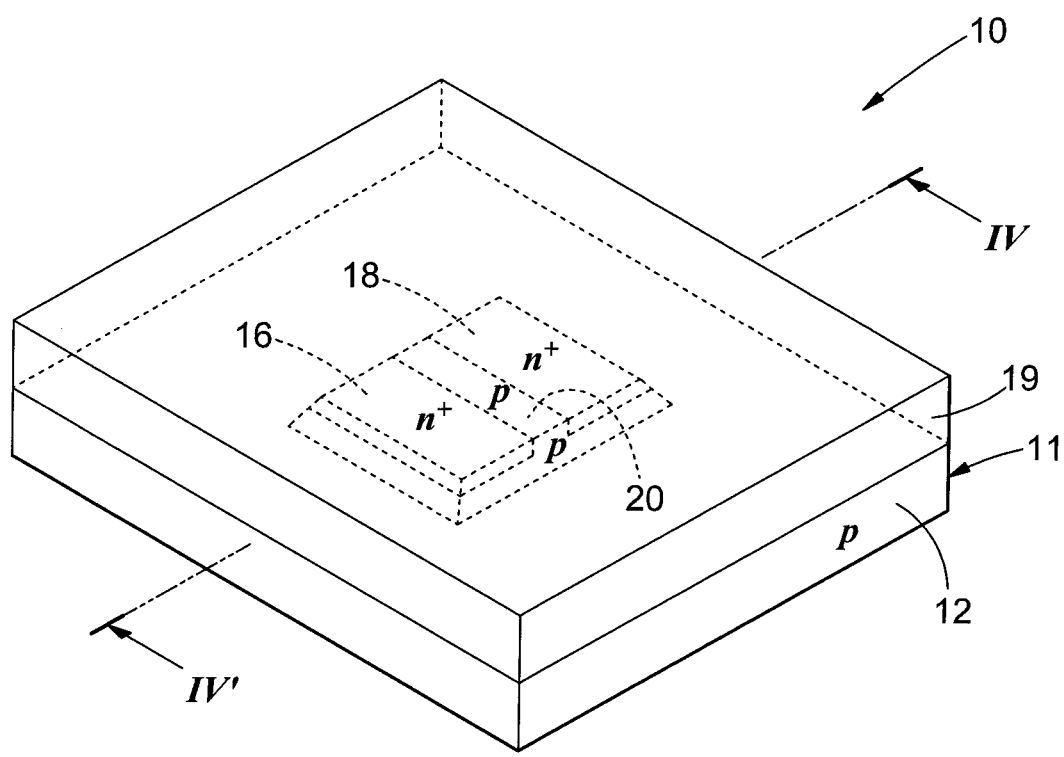
FIG. 3 is a diagrammatic isometric view corresponding to FIG. 1, but of a light emitting device according to the invention.
Figure 4:
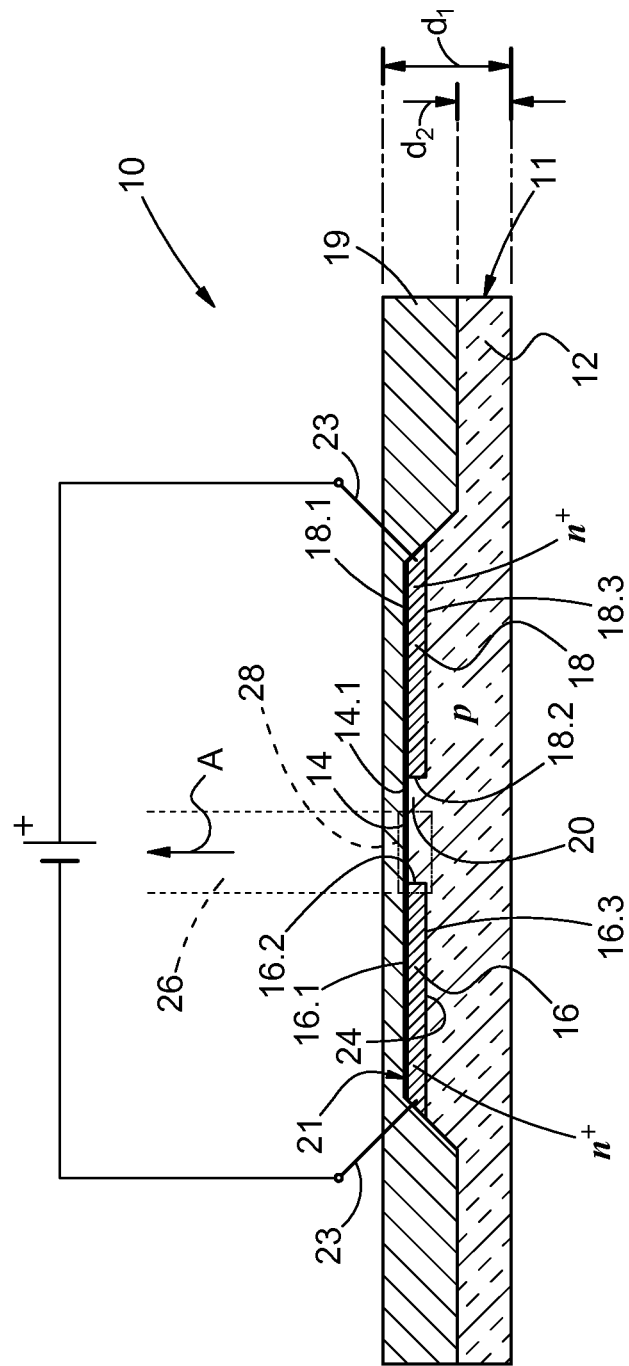
FIG. 4 is a section on line IV in FIG. 3.

A light emitting device according to the invention is generally designated by the reference numeral 10 in FIGS. 3 and 4.

The light emitting device 10 comprises a body 11 comprising a substrate 12 of a semiconductor material. In the example embodiment shown, an indirect bandgap semiconductor material, in the form of silicon, of a first doping kind p and a first doping concentration is used. The substrate has a plurality of thickness dimensions $d_1$ and $d_d$ and a first upper surface 14. A first island 16 of a second doping kind and a second doping concentration $n^+$ and a second island 18 of a third doping kind and a third doping concentration (in this case also $n^+$) are formed on one side of the upper surface 14 of the substrate 12 according to a standard bulk semiconductor fabrication process (such as a standard sub-micron process, such as a standard 0.35 .mu·m CMOS process) utilizing lateral device isolation techniques utilizing lateral active area physical isolation (such as LOCOS or STI). The first island is embedded in the substrate 12 adjacent the upper surface 14 and the first island 16 has an upper surface 16.1, which is aligned with the upper surface 14 and a bottom 16.3, which interfaces with the substrate 12. The second island 18 is spaced laterally from the first island 16, so that the first and second islands have mutually facing faces 16.2 and 18.2. The second island has an upper surface 18.1, which is also aligned with the upper surface 14 and a bottom 18.3, which interfaces with the substrate 12. Hence, the substrate 12 provides a laterally extending link 20 extending between the first island 16 and the second island 18. The link 20 has an upper surface 14.1 coinciding with the upper surface 14 of the substrate 12. The first upper surface 14 comprises a plurality of surface parts. The upper surface 16.1 of the first island forms a first part of the plurality of parts, the upper surface 18.1 of the second island forms a second part of the plurality of surface parts and the third part 14.1 comprises a portion of the upper surface 14 located between the first part 16.1 and the second part 18.1. Hence, the upper surface 14.1 of the link, the upper surface 16.1 of the first island and the upper surface 18.1 of the second island collectively form a planar interface 21 between the body 11 and an isolation layer 19 of the device. The link 20 is integrally provided by the body 12 and extends linearly, that is in a straight line all the way between at least parts of the mutually facing faces 16.2 and 18.2. A terminal arrangement 23 is connected to the body and is configured to apply a reverse bias to a first junction 24 which is formed between the substrate 12 and the first island 16, to cause a breakdown mode of the first junction 24, thereby to cause the device 10 to emit light. The device 10 is configured in a region 26 of the device to facilitate the transmission of the emitted light outwardly from and transversely to the device 10 in a general direction A away from the substrate. The region 26 extends on another side of the upper surface 14 of the substrate perpendicularly away from a zone 28 of the device. The zone 28 is preferably an upper surface zone covering the first face 16.1 and at least part of a depletion region (not shown) extending, in use, from the first face 16.1 into the link 20. For example, the device 10 may be so configured in that the region 26 does not comprise any light transmission inhibiting structure or component, such as a conductor or semiconductor body, such as that used for a gate structure.

Figure 1:
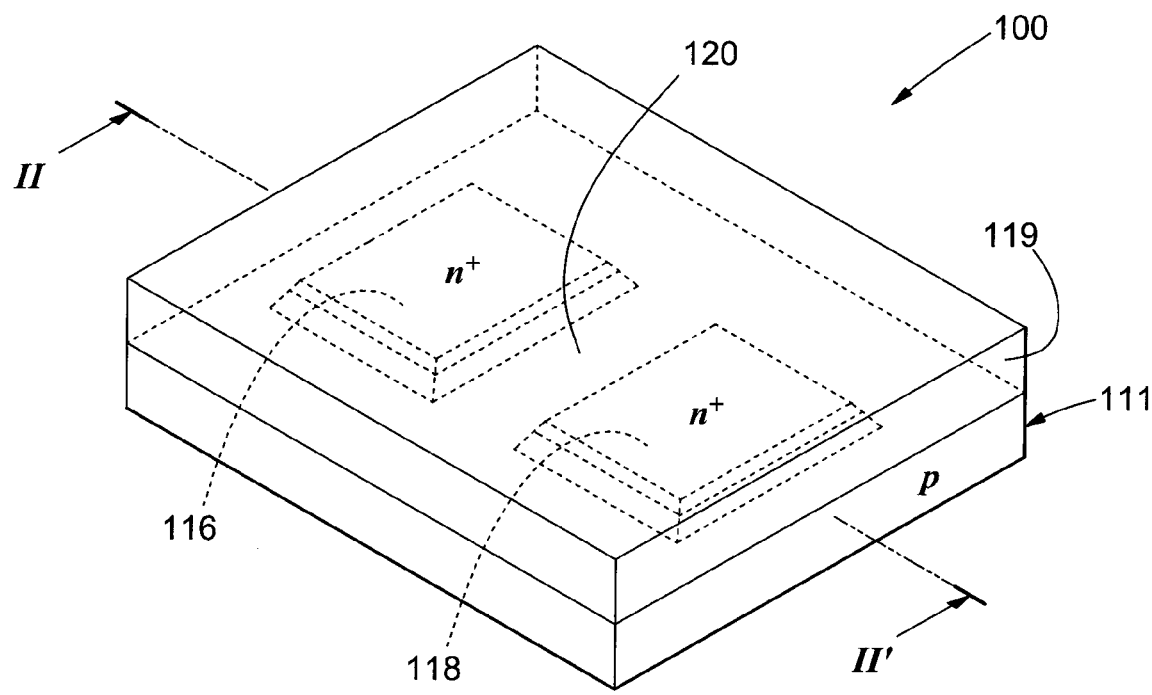
FIG. 1 is a diagrammatic isometric view of relevant parts of a prior art light emitting device.
Figure 2:
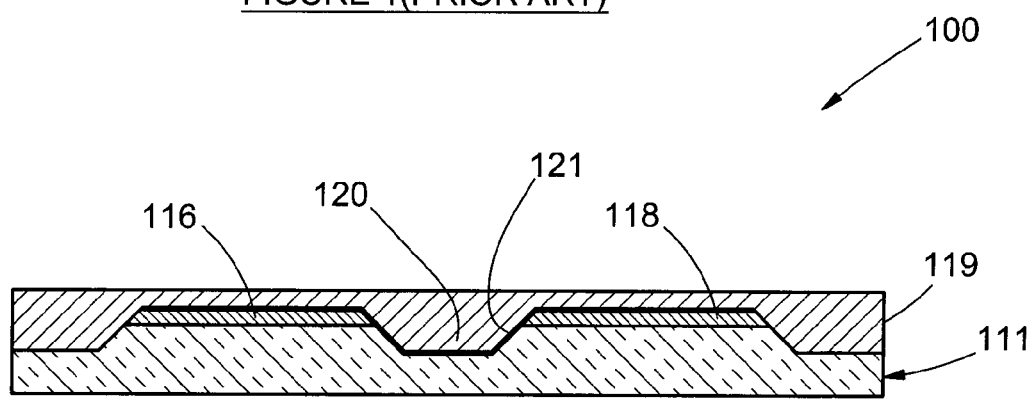
FIG. 2 is a section on line II in FIG. 1.

Referring to FIGS. 1 and 2, an example of a prior art device 100 referred to in the introduction of this specification is illustrated. The silicon dioxide isolation barriers 120 formed by the LOCOS or STI isolation techniques laterally to isolate the implanted active regions 116 and 118, are clearly shown. The result is that an interface 121 between the body 111 of the prior art device and the isolation layer 119 is stepped. As stated in the introduction of this specification, the disadvantage of these barriers 120 is that the barriers inhibit punch-through and reach-through effects, which effects may advantageously be used to improve electroluminescence effects in the device.

A method according to the invention of fabricating a light emitting device utilizing a standard bulk semiconductor fabrication process of the type wherein lateral device isolation techniques are used to form isolation barriers to isolate from one another doped implanted active regions, but adapted to inhibit the isolation barriers from forming between selected active regions, is fully compatible with the aforementioned standard process. Generally, in these standard processes, a layer defined as ACTIVE or DIFF is used to indicate where field oxide growth or trench formation is to be inhibited. A separate set of masks is created for the implantation definition step, where it is indicated where n or p dopants are to be implanted. In some standard processes, if active regions are defined as n$^+$, all other active regions would automatically be doped p$^+$. However, in the method according to the invention, it is necessary to be able to define n$^+$ and p$^+$ active regions independently and separately. Another requirement is that the photolithographic process defining the n$^+$ and p$^+$ active regions has an acceptable resolution for accurate geometrical definition of these regions.

Figure 6:
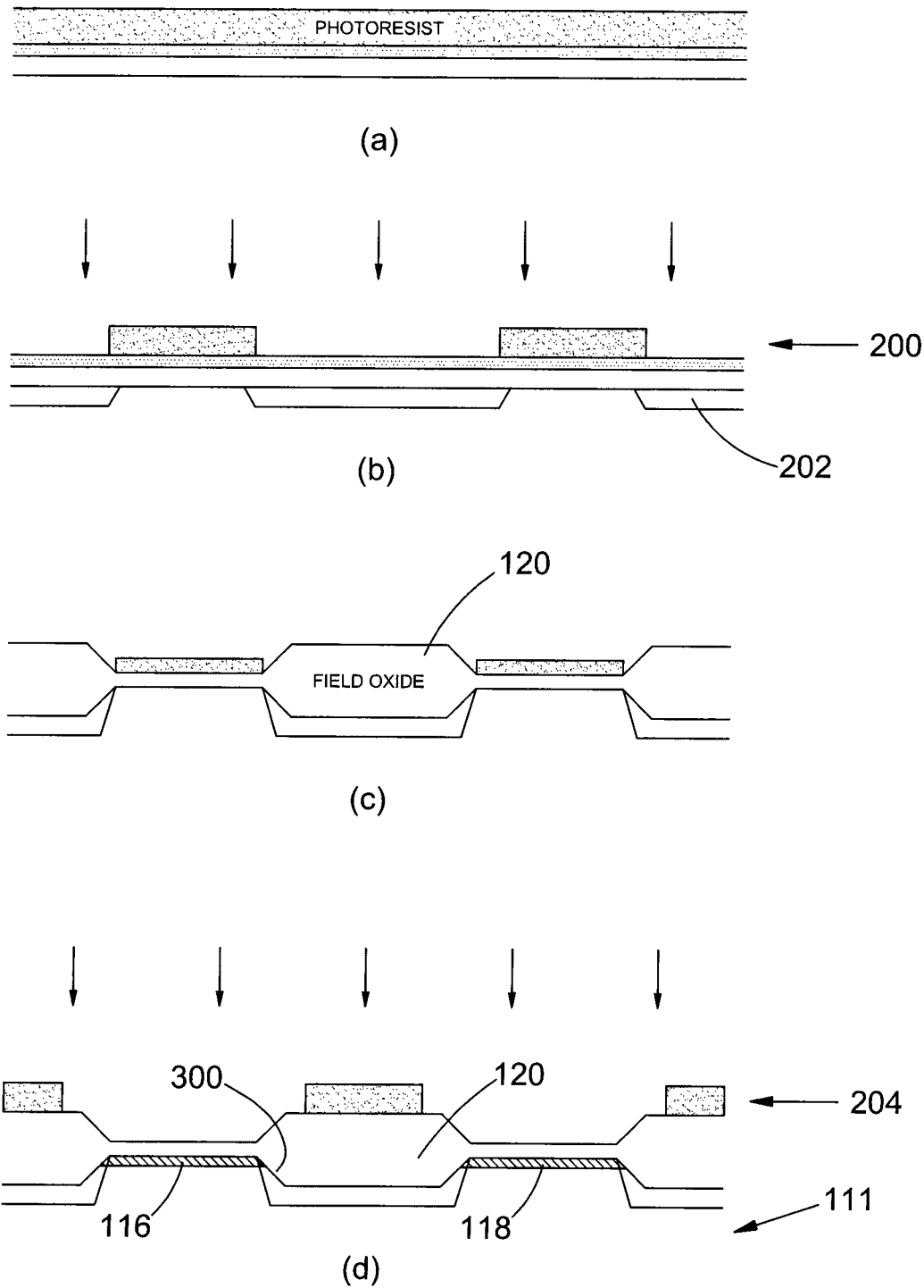
Figure 7:
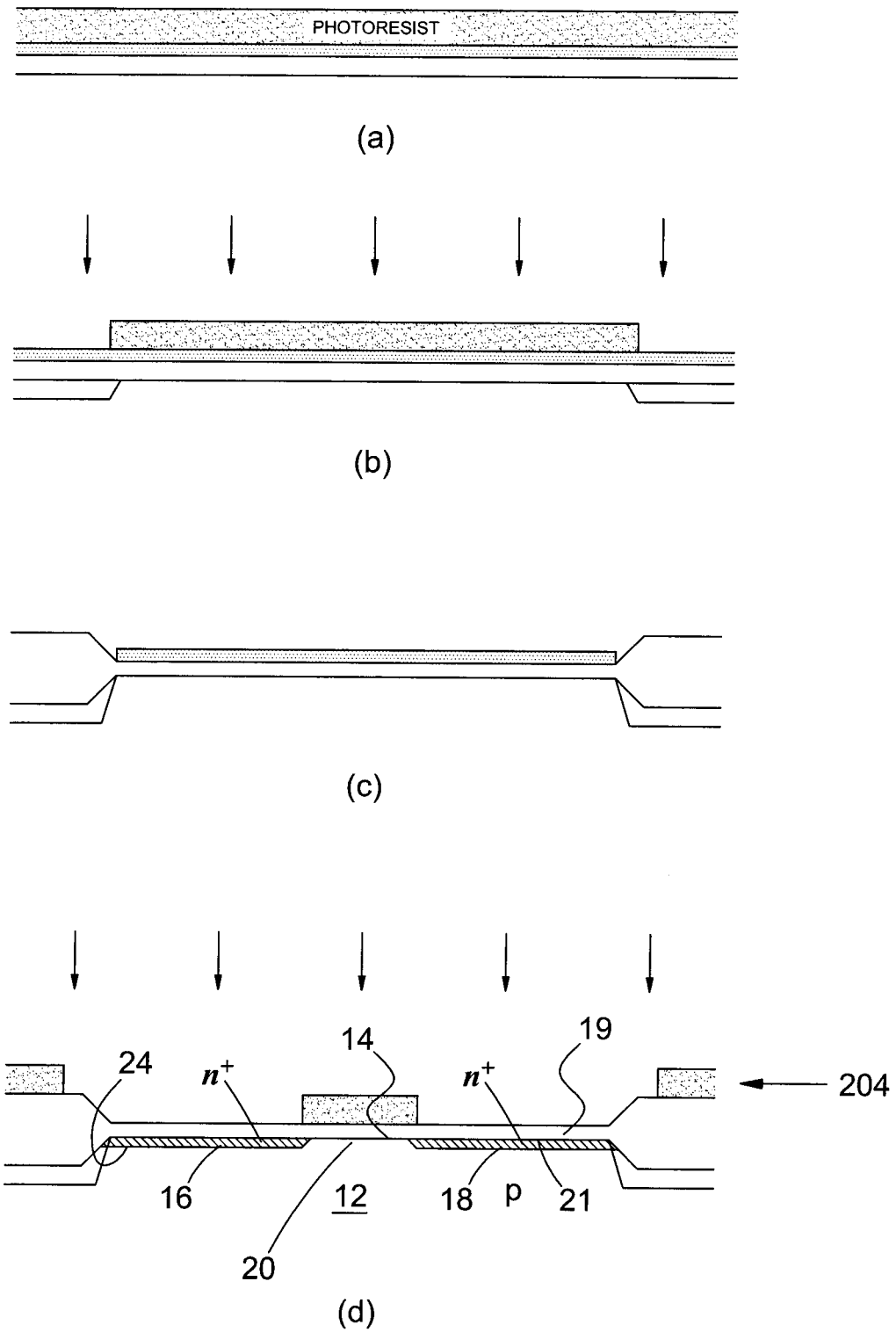

In FIG. 6(a) to (d) a standard prior art p-substrate type CMOS process is shown wherein the two n$^+$ regions 116 and 118 of FIGS. 1 and 2 are defined. The ACTIVE region mask 200 serves to define both channel stop implants 202 and regions 120 of field oxide growth in a LOCOS process, where $Si_3Ni_4$ or the like will remain to inhibit oxidation. In the absence of field oxide growth, only the gate oxide remains. A separate mask 204 is used to define n$^+$ regions 116 and 118, where both the photoresist and field oxide limit implantation into unwanted areas. The inhibiting oxide barrier 120 of FIGS. 1 and 2 with "bird-beak" formations 300 is also shown in FIG. 6(d).

Figure 5:
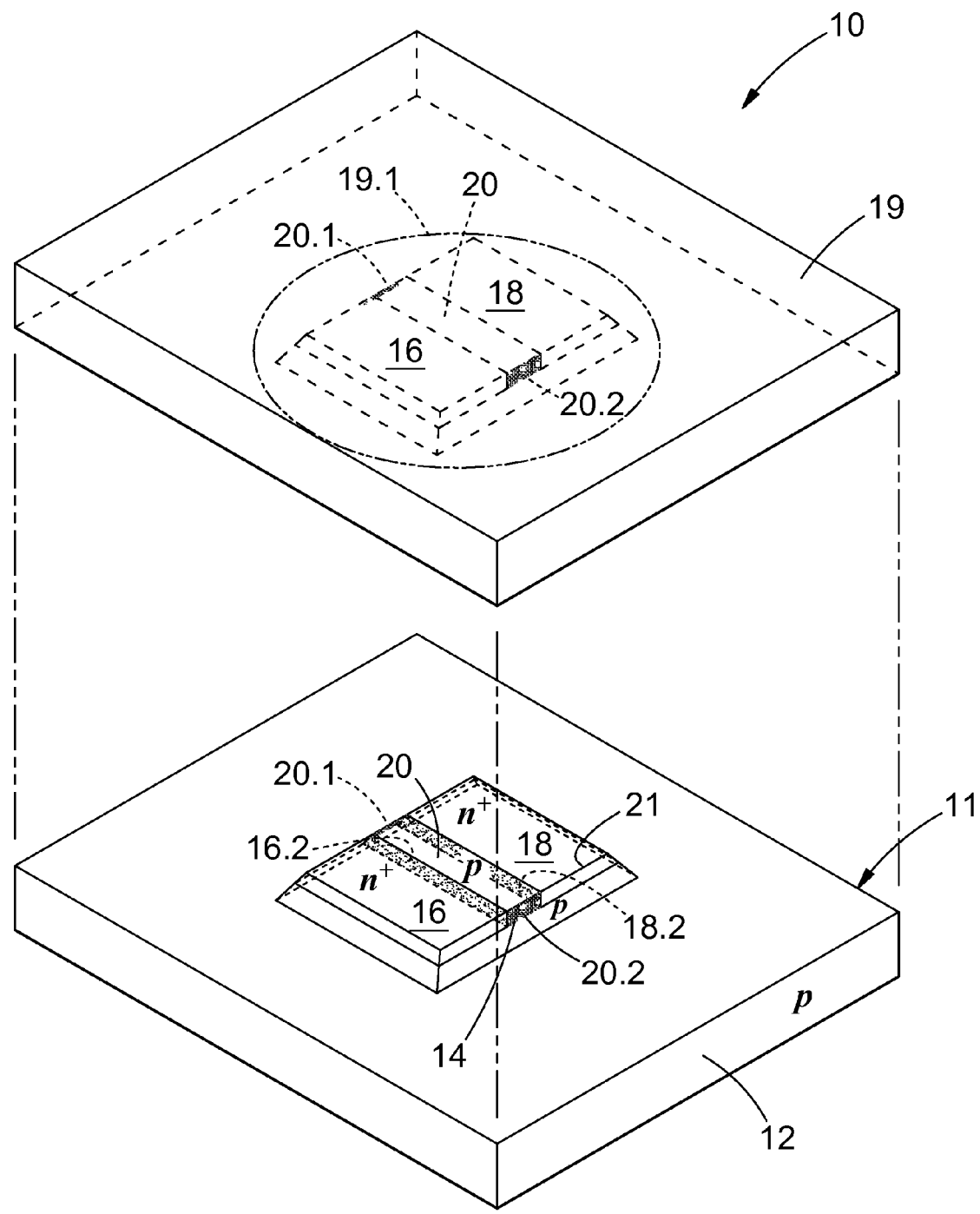
FIG. 5 is a diagrammatic exploded isometric view of the device according to the invention.

In FIGS. 7(a) to (d) one form of the method according to the invention is illustrated. The intention is to define an active region link 20 between the two n$^+$ regions 16 and 18, while the doping mask 204 separates the two regions 16 and 18. The result may be less well-defined n$^+$ regions 16 and 18, but the adapted method inhibits the formation of the lateral oxide barrier 120 and substitutes therefor the link 20 of active material p, which is integrally provided by the p substrate 12 and extends linearly and all the way between at least part of mutually facing faces 16.2 and 18.2. As best shown in FIG. 5, region 19.1 of field oxide layer 19 forms an annular termination which at least partially circumscribes the active regions 16 and 18 and terminates opposed sides 20.1 and 20.2 of the link 20.

It is believed that the device 10 according to the invention may have at least the following advantages over the prior art devices. Firstly, due to elimination of the "bird's beak" formations shown at 300 in FIG. 6(d), light generation is not expected to occur on an angled $Si/SiO_2$ interface, which may cause more light to leave the upper surface 14 and hence improve the external quantum efficiency of the device. Secondly, the isolation or $SiO_2$ layer 19, which terminates link 20 at opposed sides 20.1 and 20.2 thereof, confines electric fields and carriers in a lateral fashion between the active regions 16 and 18. Thirdly, when the aforementioned unwanted isolation barriers 120 are not present, the electrical characteristics of reach-through and punch-through devices may become less sensitive to n$^+$/p$^+$ region separation.

Normally, the spacing between the first and third regions in the sandwiched configuration is critical. For instance, reverse biasing the avalanching junction increases the physical space charge region, until avalanche occurs. If the forward biased junction's depletion region does not join the depletion region of the avalanching junction, then punch-through does not occur. On the other hand, as the spacing decreases, the probability of non-luminescent tunnelling may become prominent. Furthermore, the proximity of the $Si_3Ni_4$ LOCOS masks becomes small and the field oxide growth becomes affected, resulting in a very sudden jump from avalanche breakdown to non-radiative conduction. For example, a reach-through device with a separation distance of 300 nm might operate in tunnelling mode, while a device with separation of 450 nm is already showing strong avalanche and not reaching through anymore.

Figure 8B:
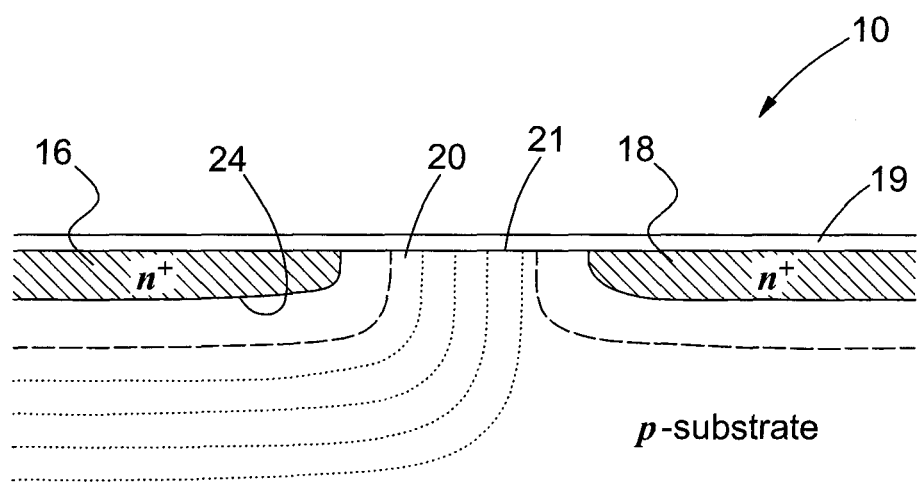

In FIG. 8(a) the effect of the prior art isolating field oxide barrier 120 on the spatial behaviour of the depletion regions is shown. As shown in FIG. 8(b), it is expected that when the barrier 120 is removed, the area exposed to punch-through becomes larger. The part of the injection region's depletion region being exposed to the junction 24 in breakdown becomes larger. This is expected to result in an increase in injected carriers reaching the junction 24 in breakdown.

Referring to FIGS. 9(a) and (b), a similar situation may be expected in the case of a device driven into reach-through mode. It is believed that with the barrier 120 removed, the growth of a space charge region as a function of reverse bias becomes better distributed and it is further believed that this may increase the chance of successful reach-through and punch-through operation for a given space range.

In FIG. 10 there is shown a self explanatory flow diagram of utilizing a standard bulk CMOS/BiCMOS process utilizing lateral active area isolation techniques adapted in accordance with the method of the invention, to form either a punch-through or reach-through light emitting device in silicon.

The invention claimed is:

1. A light emitting device comprising:
a body comprising a substrate of a semiconductor material of a first doping kind of a first doping concentration, the substrate having a plurality of thickness dimensions; and
an isolation layer adjacent to the substrate;
the substrate having a first upper surface comprising a plurality of surface parts, and having formed therein on one side of the first upper surface, and according to a bulk semiconductor fabrication process utilizing lateral active area isolation techniques utilizing bodies of an isolation material;
a first island of a second doping kind of a second doping concentration to form a first junction between the first island and the substrate, the first island having a first face, an upper surface and a bottom, the upper surface forming a first part of the plurality of surface parts and the bottom interfacing with the substrate; and
a second island of a third doping kind of a third doping concentration spaced laterally from the first island, the second island having a second face facing the first face of the first island, an upper surface and a bottom, the upper surface of the second island forming a second part of the plurality of surface parts and the bottom interfacing with the substrate, a third part of the plurality of surface parts comprising a portion of the first upper surface located between the first and second parts of the first upper surface;
the substrate providing a laterally extending link between the first face of the first island and the second face of the second island, the link comprising:
an upper surface comprising the third part of the first upper surface, such that the first, second and third parts of the first upper surface collectively form a planar interface with the adjacent isolation layer; and
opposed sidewalls, each sidewall of the link extending on the one side of the first upper surface from the first face of the first island to the second face of the second island, so that each sidewall abuts a region of the isolation layer extending beyond the planar interface;
a terminal arrangement connected to the body and configured to establish a reverse bias voltage over the first junction to cause a breakdown mode of the first junction, thereby to cause the device to emit light; and a region configured to facilitate the transmission of the emitted light, the region extending on another side of the first upper surface of the substrate, perpendicularly away from a zone comprising at least one of the first face and at least part of the link adjacent to the first face.

2. The light emitting device as claimed in claim 1 wherein the first doping kind is opposite to the second doping kind and wherein the third doping kind is the same as the second doping kind.

3. The light emitting device as claimed in claim 2 wherein the terminal arrangement is configured to apply a forward bias to a second junction which is between the second island and the substrate.

4. The light emitting device as claimed in claim 1 wherein the first doping kind is opposite to the second doping kind, wherein the third doping kind is the same as the first doping kind and wherein the first doping concentration is lower than the third doping concentration.

5. The light emitting device as claimed in claim 4 which is configured such that a depletion region extending from the first face extends through the link and reaches the second island, before the first junction enters the breakdown mode.

6. The light emitting device as claimed in claim 1 wherein the semiconductor material comprises an indirect bandgap semiconductor material.

7. The light emitting device as claimed in claim 6 wherein the indirect bandgap semiconductor material comprises silicon and wherein the bulk semiconductor fabrication process is one of a sub-micron bulk complementary metal oxide semiconductor (CMOS) and bipolar complementary metal oxide semiconductor (BiCMOS) process.

8. The light emitting device as claimed in claim 1 wherein the first island, the second island and the link collectively, when viewed in plan, are at least partially circumscribed by the region of the isolation layer extending beyond the planar interface.

9. A method of fabricating a light emitting device, the method comprising:

utilizing a bulk semiconductor fabricating process of a kind in which lateral active region isolation techniques are used to form a barrier of an isolation material between mutually facing faces of spaced first and second active regions;

forming in a substrate of a semiconductor material of a first doping kind and on one side of a first upper surface of the substrate, a first active region in the form of a first island of a second doping kind and a second active region in the form of a second island of a third doping kind spaced laterally from the first island, so that the first and second islands have mutually facing first and second faces respectively, and so that the substrate provides a laterally extending link between the mutually facing faces, and wherein a bottom of the first island and a bottom of the second island interface with the substrate, the link comprising:

an upper surface coinciding with at least part of the first upper surface of the substrate, such that the upper surface of the link, an upper surface of the first island and an upper surface of the second island collectively form a planar interface with an isolation layer adjacent to the substrate; and opposed sidewalls, each of the sidewalls extending on the one side of the first upper surface of the substrate from the first face of the first island to the second face of the second island;

forming a region of the layer of an isolation material to extend beyond the planar interface to abut each of the opposed sidewalls of the link and inhibiting formation of a barrier of the isolation material between at least parts of the mutually facing faces; and adapting a region of the device between the first and second islands and on another side of the first upper surface, to facilitate transmission of light emitted by the device.

10. A light emitting device comprising:

a body comprising a substrate of a semiconductor material of a first doping kind of a first doping concentration, the substrate having a plurality of thickness dimensions; and an isolation layer adjacent the substrate;

the substrate having a first upper surface comprising a plurality of surface parts and having formed therein on one side of the first upper surface:

a first island of a second doping kind of a second doping concentration to form a first junction between the first island and the substrate, the first island having a first face, an upper surface and a bottom, the upper surface forming a first part of the plurality of surface parts and the bottom interfacing with the substrate so as to form the first junction between the first island and the substrate; and a second island of a third doping kind of a third doping concentration spaced laterally from the first island, the second island having a second face facing the first face of the first island, an upper surface and a bottom, the upper surface of the second island forming a second part of the plurality of surface parts and the bottom interfacing with the substrate, a third part of the plurality of surface parts comprising a portion of the first upper surface located between the first and second parts of the first upper surface;

the substrate providing a laterally extending link between the first face of the first island and the second face of the second island, the link comprising:

an upper surface comprising the third part of the first upper surface, such that the first, second and third parts of the first upper surface collectively form a planar interface with the adjacent isolation layer; and opposed sidewalls, each sidewall of the link extending on the one side of the first upper surface from the first face of the first island to the second face of the second island, so that each sidewall abuts a region of the isolation layer extending beyond the planar interface;

a terminal arrangement connected to the body and configured to establish a bias voltage over the first junction, thereby to cause the device to emit light; and a region configured to facilitate the transmission of the emitted light, the region extending on another side of the first upper surface of the substrate away from a zone comprising at least one of the first face and at least part of the link adjacent the first face.

11. A method of fabricating a light emitting device, the method comprising:

forming in a substrate of a semiconductor material of a first doping kind and on one side of a first upper surface of the substrate, a first active region in the form of a first island of a second doping kind and a second active region in the form of a second island of a third doping kind spaced laterally from the first island, so that a bottom of the first island and a bottom of the second island interface with the substrate, so that the first and second islands have mutually facing first and second faces respectively, and so that the substrate provides a laterally extending link between the mutually facing faces, the link comprising:

an upper surface coinciding with at least part of the first upper surface of the substrate such that the upper surface of the link, an upper surface of the first island and an upper surface of the second island collectively form a planar interface with an isolation layer adjacent to the substrate; and opposed sidewalls, each of the sidewalls extending on the one side of the first upper surface from the first face of the first island to the second face of the second island;

forming a region of the isolation layer to extend beyond the planar interface to abut each of the opposed sidewalls of the link; and adapting a region of the device between the first and second islands and on another side of the first upper surface, to facilitate transmission of light emitted by the device.

12. The method as claimed in claim 9 where the fabrication process is a sub-micron fabrication process.

13. The method as claimed in claim 9 wherein the lateral active region isolation technique comprises one of the local oxidation of silicon (LOCOS) and shallow trench isolation (STI).

14. The method as claimed in claim 9 comprising the steps of applying a blocking structure for inhibiting formation of a barrier of the isolation material between the at least parts of the mutually facing faces whilst forming the region of the layer of the isolation material to abut on the sidewalls; and forming the first and second islands in the substrate utilizing at least a first doping mask.

15. The method as claimed in claim 14 wherein both the first and second islands are formed utilizing the first doping mask.

16. The method as claimed in claim 14 wherein the first island is formed utilizing the first mask and the second island is formed utilizing a second mask.

* * * * *